United States Patent [19]

Martin et al.

[11] Patent Number: 4,818,658

[45] Date of Patent: Apr. 4, 1989

[54] PHOTOACTIVE ESTERIFICATION PRODUCT OF A DIAZOOXIDE COMPOUND AND A CURCUMIN DYE AND PHOTORESIST MATERIALS WITH PRODUCT

[75] Inventors: Robert L. Martin, Framingham; M. Martha Rajaratnam, Winthrop; Pamela Turci, Boxboro, all of Mass.

[73] Assignee: Shipley Company Inc., Newton, Mass.

[21] Appl. No.: 39,170

[22] Filed: Apr. 17, 1987

[51] Int. Cl.$^4$ .................... G03C 1/54; C07C 113/00
[52] U.S. Cl. .................... 430/156; 430/165; 430/166; 430/191; 430/192; 430/193; 430/258; 430/311; 430/312; 430/326; 534/557
[58] Field of Search .............. 430/193, 191, 192, 156, 430/258, 311, 312, 326, 166, 165

[56] References Cited

U.S. PATENT DOCUMENTS

| | | | |
|---|---|---|---|
| 3,046,115 | 7/1962 | Schmidt et al. | 430/193 |
| 3,046,116 | 7/1962 | Schmidt | 430/193 |
| 4,594,306 | 6/1986 | Stahlhofen | 430/191 |

FOREIGN PATENT DOCUMENTS

| | | | |
|---|---|---|---|
| 200129 | 11/1986 | European Pat. Off. | |
| 1039475 | 8/1966 | United Kingdom | 430/191 |
| 1052699 | 12/1966 | United Kingdom | 430/191 |

OTHER PUBLICATIONS

English Translation of Europe Patent #200,129 issued to Merrem on 11/5/1986.

*Primary Examiner*—Charles L. Bowers, Jr.
*Attorney, Agent, or Firm*—Robert L. Goldberg

[57] ABSTRACT

The subject invention involves reduction of light reflection into a photoresist coating over a reflective substrate by the use of a photoactive compound in a photoresist formulation that is the reaction product of a diazooxide and curcumin.

19 Claims, No Drawings

PHOTOACTIVE ESTERIFICATION PRODUCT OF A DIAZOOXIDE COMPOUND AND A CURCUMIN DYE AND PHOTORESIST MATERIALS WITH PRODUCT

BACKGROUND OF THE INVENTION

1. Introduction

This invention relates to novel photoactive compounds and to photoresists using said photoactive compounds. More particularly, this invention relates to positive working photoresists that possess light attenuating capability when exposed to near ultraviolet to visible radiation and use an esterification product of a diazooxide and curcumin dye as the photoactive compound.

2. Description of the Prior Art

Photoresist compositions are known in the art and are described in numerous publications including De Forest, *Photoresist Materials and Processes,* McGraw-Hill Book Company, New York, 1975. Photoresists comprise coating produced from solution or applied as a dry film which, when exposed to light of the proper wavelength, are chemically altered in their solubility to certain solvents (developers). Two types are known. The negative acting photoresist is initially a mixture which is soluble in its developer but following exposure to activating radiation, becomes insoluble in developer thereby defining a latent image. Positive working photoresists work in the opposite fashion, light exposure making the resist soluble in developer.

Positive working photoresists are more expensive than negative working photoresists but are capable of providing superior image resolution. For example, positive working photoresists can be developed to yield relief images with a line width as low as 1 micron or less. In addition, considering the cross section of a photoresist image, the channels formed in the photoresist by development have square corners and side walls with only minimal taper.

Most positive working photoresists comprise a photoactive compound in a film forming polymeric binder. Photoactive compounds or sensitizers, as they are often called, most frequently used are esters and amides formed from o-quinone diazide sulfonic and carboxylic acids. These esters and amides are well known in the art and described by De Forest, supra, pages 47 through 55, incorporated herein by reference. These light sensitive compounds, and the methods used to make the same, are all well documented in prior patents including German Pat. No. 865,140 and U.S. Pat. Nos. 2,767,092; 3,046,110; 3,046,112; 3,046,119; 3,046,121; 3,046,122 and 3,106,465. Additional sulfonamide sensitizers that have been used in the formulation of positive working photoresists are shown in U.S. Pat. No. 3,637,384. These materials are formed by the reaction of a suitable diazide of an aromatic sulfonyl chloride with an appropriate resin amine. Methods for the manufacture of these sensitizers and examples of the same are shown in U.S. Pat. No. 2,797,213. Other positive working diazo compounds have been used for specific purposes. For example, a diazo compound used as a positive working photoresist for deep U.V. lithography in Meldrum's diazo and its analogues as described by Clecak et al, "Technical Disclosure Bulletin," Vol. 24, No. 4, September 1981, IBM Corp., pp. 1907 and 1908. An o-quinone diazide compound suitable for laser imaging is shown in U.S. Pat. No. 4,207,107.

The resin binders most frequently used with the o-quinone diazides in commercial practice are the alkali soluble phenol formaldehyde resins known as the Novolak resins. Photoresists using such polymers are illustrated in U.K. Patent No. 1,110,017. These materials are the product of a reaction of a phenol and formaldehyde under conditions whereby a thermoplastic polymer is formed with a melting point of about 125° C. Novolaks with melting points well in excess of 125° C. are known but are not generally used in photoresist formulations because they are often brittle or have other properties limiting their use.

Another class of binders used with the o-quinone diazides are the homopolymers and copolymers of vinyl phenol. Photoresists of this nature are disclosed in U.S. Pat. No. 3,869,292. It is believed that photoresists using binders of polymers formed from vinyl phenols have not been used in commerce.

Another positive resist known to the art utilizes a resin that is a partially aqueous soluble imidized acrylic polymer in a non aqueous solvent. Such a resist is disclosed in U.S. Pat. No. 4,524,121. The aqueous soluble, imidized acrylic polymers, known in the art as polyglutarimides, can be dissolved in a non-reactive, non-aqueous solvent to form a positive resist that can be deposited as an adherent film on a substrate. Such films are capable of high image resolution.

Other suitable binders for positive acting photoresists include the terpolymers of an alkyl acrylate, a styrene and an acid as disclosed in U.S. Pat. No. 3,637,384 and the polyamic condensation products of an aromatic dianhydride and an aromatic di-primary amine as disclosed in U.S. Pat. No. 4,093,461.

All of the aforesaid references are incorporated herein by reference for their teachings of photoactive compounds, binders and photoresist formulations.

Photoresists of the type described above are used in integrated circuit fabrication where significant effort has been expended on increasing the resolution capabilities of the photoresists to enable a greater number of circuits to be placed on a single chip. This increase in circuit density increases the potential complexity and speed of the resulting integrated circuit.

Present techniques in optical projection printing can resolve on micron lines in photoresists with good line width control when flat, low reflectivity substrates are used. However, when exposing resists on substrates with surface topography, there are resist-controlled problems introduced by optical reflections and by resist thickness non-uniformity.

Reflection of light from the substrate photoresist interface produces variations in the light intensity in the photoresist during exposure resulting in non-uniform line width. Light can scatter from the interface into regions of the resist where no exposure was intended resulting in a narrowing of the line width. The amount of scattering and reflection will typically vary from region to region resulting in line width non-uniformity.

To eliminate the effects of chromatic aberration, monochromatic or quasi-monochromatic light is commonly used in photoresist projection techniques to expose the photoresist. Unfortunately, the effects of interface reflections on resolution is particularly significant when monochromatic or quasi-monochromatic light is used to expose the photoresist. When such light reflects from the substrate photoresist interface, the reflected light interferes with the incident light to form standing waves within the photoresist. In the case of highly reflective substrate regions, the resulting large standing wave ratio creates thin layers of under exposed resist at the standing wave minima. The under exposed layers can prevent complete photoresist development causing a jagged resist profile. Part of the reflected light also reflects back to the substrate from the top surface of the resist. Such multiple reflection of the incident light between the top and bottom surfaces of the photoresist layer result in a resonance affecting the light intensity within the resist. The time required to expose the photoresist is generally an increasing function of photoresist thickness because of the increase total amount of light required to expose an increased amount of photoresist. However, because of the resonant affect, the time of exposure also includes a harmonic component which varies between successive maximum and minimum values as the resist thickness varies through a quarter wavelength of the incident light. If the photoresist thickness is non-uniform, there will be a non-uniform exposure resulting in variable line width control.

The prior art has reduced scattering and reflection within photoresist layers by addition of dyes to photoresist compositions that absorb at or near the wavelength used to expose the photoresist. Typical dyes that have been used for this purpose include the Coumarin dyes, methyl orange and methanil yellow. These dyes absorb at the conventional exposure wavelength of 436 nm. However, it has been found that the addition of such dyes to photoresist compositions create other problems. For example, in some cases, the dye in a photoresist coating composition may cause striations in the final coating. In addition, shelf life problem may be encountered due to dye precipitation during storage. Further, because of limited solubility, such dyes can only be added to photoresist formulations in concentrations inadequate to fully attenuate reflected light. In this respect, because the dye absorbs at the activating radiation for the photoresist, the presence of the dye results in a requirement for longer exposure time or greater exposure intensity, or alternatively, dissolution rate of the photoresist during development is inhibited. For this reason even if the dye could be dissolved in the photoresist in greater concentration, the dye in greater concentration may render the photoresist inoperative.

Due to problems arising from addition of a dye directly to a photoresist formulation, the art has attempted to use dyes to absorb reflected light by means other than by direct addition to the formulation. One method is disclosed by H. A. Koury and K. V. Patel, Anti-Interference Phenomena Coating, IBM Technical Disclosure Bulletin, Vol. 13, No. 1, p. 38, June, 1970 where a thin ultraviolet light-absorbing layer containing a dye such as the aforesaid methyl orange or methanil yellow is deposited at the substrate-resist interface and is overcoated with the photoresist layer. Another method of utilizing a dye is disclosed in U.S. Pat. No. 4,362,809 where the substrate surface is covered with a bottom layer of resist containing a dye of a thickness sufficient to produce a planar surface. The top photoresist layer functions as a portable conformable mask. The two photoresist layers are selected to be sensitive to differing wavelengths of activating radiation. The top resist layer comprising the portable conformable mask is exposed and developed to produce a mask opaque to deep ultraviolet light. The bottom layer is then exposed through the mask with deep ultraviolet light and developed to produce the desired photoresist pattern. The dye in the bottom layer absorbs within the range of wavelengths used to expose the top resist layer to reduce problems due to substrate resist interface reflections.

The above cited references are incorporated herein for their teachings of dyes in resist layers.

Copending U.S. patent application Ser. No. 06/922,391 filed Oct. 23, 1986, incorporated herein by reference, and assigned to the same assignee as the subject application, is directed to a photoresist formulation containing the dye curcumin for the purpose of absorbing light within a wavelength of 400 to 460 nm, the wavelength used to form the latent image within the photoresist layer. Curcumin is said to significantly reduce reflection from a photoresist film-substrate interface during exposure of the photoresist film to activating radiation. The use of curcumin is said to be a significant improvement over other dyes capable of absorbing within the same wavelength because it is substantially more soluble than other dyes used for similar purpose. Because of enhanced solubility, the dye can be used in greater concentration than other dyes whereby it is capable of absorbing a greater quantity of reflected light. In addition, it can be used in concentrations lower than its solubility limit in the photoresist formulation thereby avoiding precipitation during storage. Further, though the dye absorbs at the proper wavelength, and does prevent reflection, it does not decrease dissolution of the resist during development to the same extent as other dyes and for this reason, can be used in higher concentration than other dyes.

SUMMARY OF THE INVENTION

The subject invention is an improvement over the above-cited copending patent application Ser. No. 06/922,391. The invention is directed to a new class of compounds that comprise the esterification product of a diazooxide of an aromatic sulfonic acid and curcumin. In addition, the invention is directed to a photoresist formulation responsive to activating radiation within a wavelength range of from about 200 to 460 nm comprising a polymer binder containing the aforesaid esterification product. The esterification product functions both as the photoactive compound and as a dye capable of absorbing reflected light at the wavelength used to expose the photoresist.

The use of the esterification product of the diazooxide and curcumin as the photoactive compound and the dye is an improvement over the use of each individually because the concentration of the dye can be increased beyond its normal solubility limit since it is chemically combined with the photoactive compound. Moreover, its concentration may be more easily controlled in the photoresist formulation because it is a reaction product formed in accordance with a known chemical reaction. Further, dye precipitation during storage as encountered by the prior art is avoided because the dye is held in the formulation and in solution by its chemical combination with the diazooxide. Finally, by chemical combination of the dye with the diazooxide, photoresist manufacture is simplified and cost of manufacture is reduced.

DESCRIPTION OF THE PREFERRED EMBODIMENTS

The photoresists of this invention are compositions responsive to activating radiation within a wavelength varying from about 200 to about 460 nm and comprising a polymeric binder and a photoactive compound that is the esterification product of a diazooxide and curcumin. Typical examples of such photoresists are alkali soluble, positive acting photoresists utilizing either a novolak resin or a polyvinyl phenol binder activated with a photoactive diazooxide compound for imaging. Another example of photoresists within the scope of the invention are those formulated from a polyglutarimide. Polyglutarimide photoresists do not require a photoactive compound for imaging but often contain a diazooxide photoactive compound to increase the reactivity of the photoresist. Polyglutarimide photoresists containing a diazooxide photoactive compound are within the scope of the subject invention. Components of the photoresists that are the subject of the invention, the concentrations of the components and solvents required to form coating compositions from the photoresists are described in the prior art as are methods used to coat and image the same. U.K. Patent No. 1,110,017 cited above describes photoresists formulated using novolak resin binders. U.S. Pat. No. 3,869,292 cited above describes photoresists using polyvinyl phenol resin binders. U.S. Pat. No. 4,524,121 cited above described photoresists formulated from polyglutarimides. U.S. Pat. No. 3,637,384 cited above described photoresists formulated from specific terpolymers. U.S. Pat. No. 4,093,461 cited above discloses photoresists formulated from polyamic condensation products.

In accordance with the invention, a photoactive diazooxide is esterified with the dye curcumin and the reaction product is used in the photoresist as both the light sensitive compound and the dye used to absorb reflected light. Curcumin [1,7-bis (4-hydroxy-3-methoxy phenyl)-1,6-heptadiene-3,5-dione], is also known as turmeric yellow and diferuloylmethane. It is described and discussed in numerous references including Vogel, *Ann.* 44, 297 (1842); Perkin, Phipps, *J. Chem. Soc.* (Trans.) 85,I, 64 (1904); Rao, Shintre, *J. Soc. Chem. Ind.* 47, 54T, (1928); Lampe, *Ber.* 51, 1347 (1918); and Stieglitz, Horn. German Patent No. 859,145, (1952).

The reaction of diazo oxides with aromatic compounds having pendant hydroxyl groups is known in the art. Such reactions are shown in U.S. Pat. Nos. 3,046,118 and 3,046,121 incorporated herein by reference for reaction conditions and reactants. The diazooxide used for such reactions may be represented by the formula:

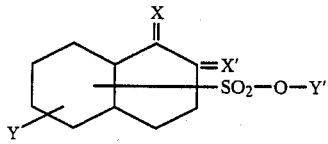

where X and X' are $N_2$ or O and are different from each other, Y is hydrogen or halogen and Y' is halogen, preferably chlorine. Curcumin has the formula:

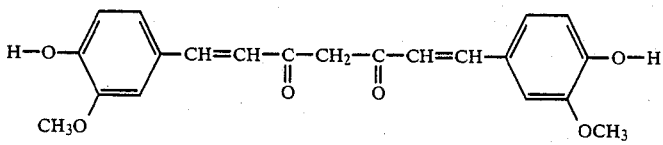

from which it can be seen that the compound has two pendant hydroxyl groups or sites where esterification between the diazooxide and the dye can take place. The reaction involves the halide of the sulfonyl halide and the hydroxyl groups of the curcumin. Since curcumin possesses two hydroxyl groups, the reaction product may be a monoester, a diester or a mixture of the two dependent upon reaction conditions and the molar ratio of the diazooxide to the curcumin.

In accordance with the preferred embodiment of the invention, the predominant reaction product is the diester whereby the preferred molar ratio of the diazooxide to the curcumin is slightly in excess of 2 to 1, for example 2.1 to 1.

The photoactive esterification products of the diazooxide and the curcumin are formed by reacting one or two moles of the appropriate [diazo oxide] sulfonyl chloride [$RSO_2Cl$] with one mole of a dihydroxy compound [HO—X—OH] in a suitable solvent medium. General reactions follow:

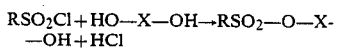

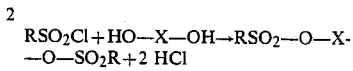

Various hydrogen halide acceptors may be utilized to neutralize the hydrogen chloride by-product from this condensation reaction, such as sodium carbonate, sodium bicarbonate, and the like, or organic bases such as primary, secondary, or tertiary amines, or organic bases such as tetramethylammonium hydroxide, tetraethylammonium hydroxide, and the like. Examples of general reactions are as follows:

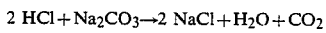

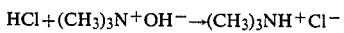

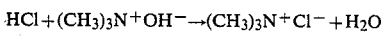

The condensation reaction media range from aqueous (with or without a suitable organic co-solvent, such as dioxane), wherein inorganic carbonates or bicarbonates perform the hydrogen halide acceptor function, to suitable organic solvents wherein organic bases are more compatible. In all cases, solvent medium selection is based on the ability to dissolve both reactants prior to addition of the hydrogen halide acceptor.

The purified diazo compounds based on the dihydroxy ballasting group are brilliant yellow crystalline solids and, in general, are difficult to dissolve in all but the most polar solvents. For example, they dissolve more readily in dimethylformamide, N-methyl-1-pyrrolidone, ethyleneglycol monomethylether, propylene glycol monomethylether acetate, dioxane, or combinations of such solvents. In many cases, it is advisable to use admixtures of difficulty soluble products and more readily soluble products. Such combinations of products are often of advantage because crystalline formations from the solution may be avoided and smoother coatings are obtained when combined with a suitable resin system such as is practiced in the preparation of lithographic printing plates or photoresist films. Further, the use of combinations of solvents may improve the clarity and smoothness of such films as is known to the organic finishing and coating arts.

Examples of esterification products within the scope of the invention include:

1,7-bis-(4-hydroxy-3-methoxyphenyl)-1,6-heptadiene-3,5-dione-3-chloro-5-Diazo-6-oxo-1,3-cyclohexadiene-1-sulfonate of the formula: [1]

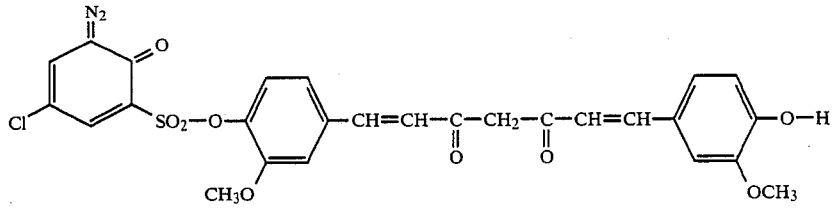

1,7-bis-(4-hydroxy-3-methoxyphenyl)-1,6-heptadiene-3,5-dione-7-chloro-2-Diazo-1-oxo-4-naphthalene sulfonate of the formula: [2]

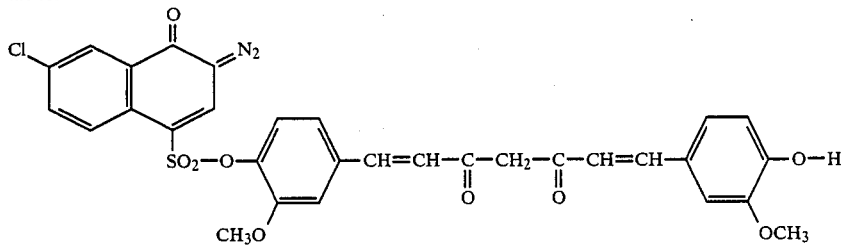

1,7-bis-(4-hydroxy-3-methoxyphenyl)-1,6-heptadiene-3,5-dione-3-Diazo-6-methyl-4-oxo-1,5-cyclohexadiene-1-disulfonate of the formula: [3]

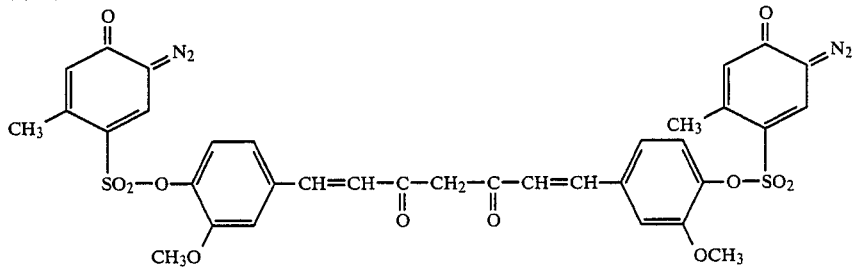

1,7-bis-(4-hydroxy-3-methoxyphenyl)-1,6-heptadiene-3,5-dione-3-Diazo-6-methyl-4-oxo-1,5-cyclohexadiene-1-sulfonate of the formula: [4]

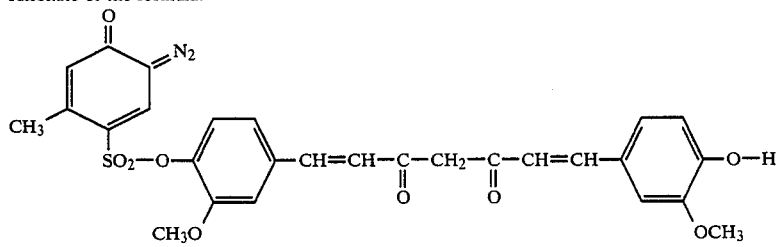

1,7-bis-(4-hydroxy-3-methoxyphenyl)-1,6-heptadiene-3,5-dione-2-Diazo-7-nitro-1-oxo-4-naphthalene sulfonate of the formula: [5]

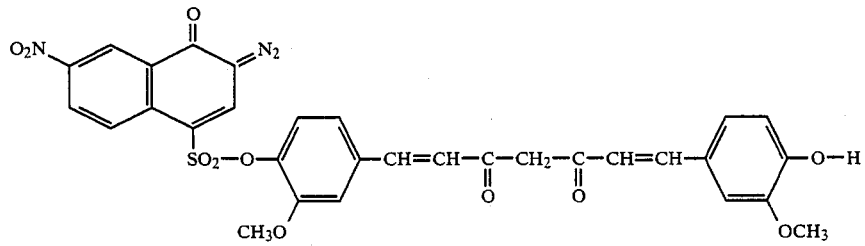

-continued 1,7-bis-(4-hydroxy-3-methoxyphenyl)-1,6-heptadiene-3,5-dione-3-Diazo-4-oxo-1,5-cyclohexadiene-1-sulfonate of the formula: [6]

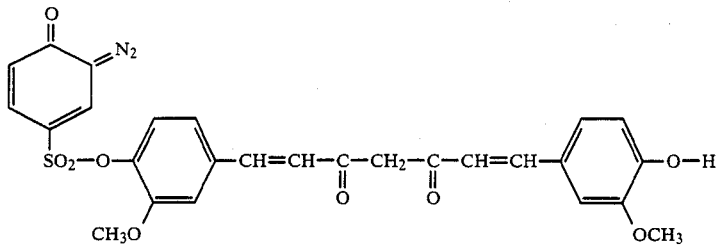

1,7-bis-(4-hydroxy-3-methoxyphenyl)-1,6-heptadiene-3,5-dione-2-Diazo-1-oxo-4-naphthalene disulfonate of the formula: [7]

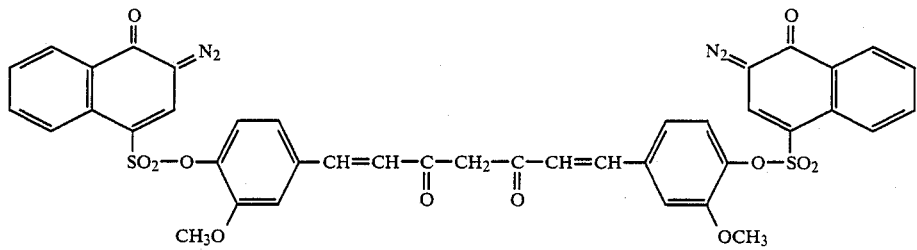

1,7-bis-(4-hydroxy-3-methoxyphenyl)-1,6-heptadiene-3,5-dione-2-Diazo-1-oxo-4-naphthalene sulfonate of the formula: [8]

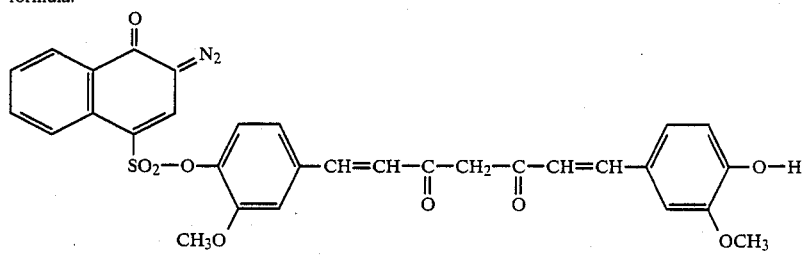

1,7-bis-(4-hydroxy-3-methoxyphenyl)-1,6-heptadiene-3,5-dione-2-Diazo-1-oxo-5-naphthalene disulfonate of the formula: [9]

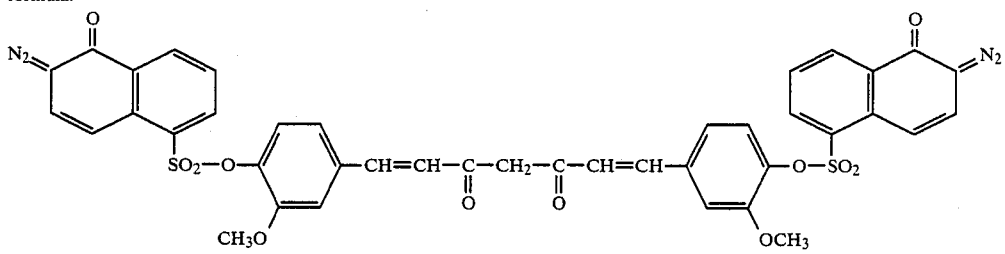

1,7-bis-(4-hydroxy-3-methoxyphenyl)-1,6-heptadiene-3,5-dione-2-Diazo-1-oxo-5-naphthalene sulfonate of the formula: [10]

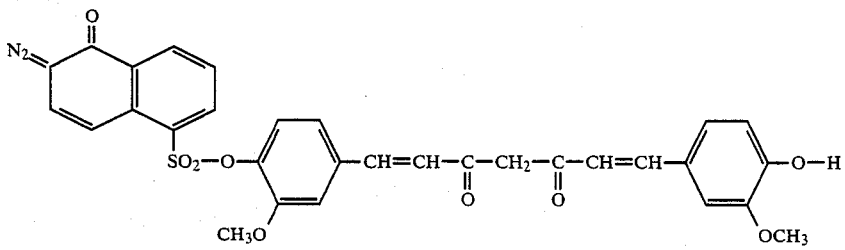

1,7-bis-(4-hydroxy-3-methoxyphenyl)-1,6-heptadiene-3,5-dione-2-Diazo-1-oxo-4-naphthalene/2-diazo-1-oxo-5-naphthalene mixed disulfonate of the formula: [11]

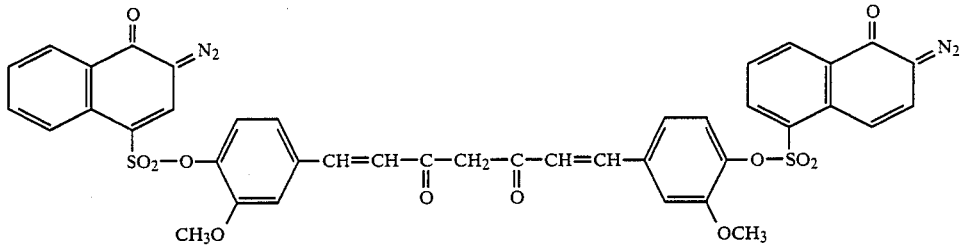

1,7-bis-(4-hydroxy-3-methoxyphenyl)-1,6-heptadiene-3,5-dione-5,6,7,8-tetrahydro-1-Diazo-2-oxo-3-naphthalene sulfonate of the formula:

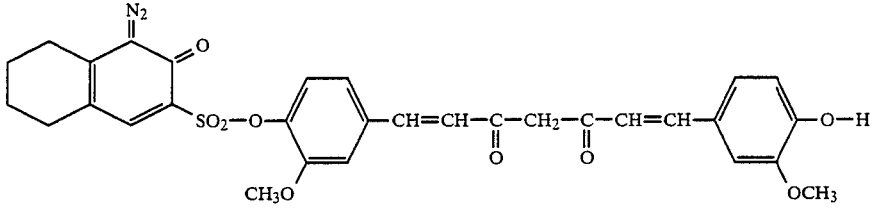

To form a photoresist, the photoactive compound of the invention is added to a resin binder in an amount ranging between 0.1 weight percent of total photoresist solids and the solubility limit of the photoactive compound in the photoresist formulation. In addition, a conventional photoactive compound (one that does not incorporate the dye in its structure) may be added to the photoresist. The use of the conventional photoactive compound in combination with the esterification product of the invention is believed to provide increased photospeed. The conventional photoactive compound may be used in a concentration of up to 90 percent of the total of the photoactive compound of this invention, and a preferred range varies between 10 and 40 percent of the total of the photoactive components.

The binder may be a resin such as novolak resin, a polyvinyl phenol or a polyglutarimide, all as described above. Photoactive compound concentrations at the upper end of the solubility range are preferred because higher concentrations result in greater light sensitivity and enhanced absorption of reflected light. However, it is also preferred that the concentration be below the solubility limit of the photoactive compound in the photoresist formulation so that precipitation of compound does not occur during storage. A preferred, though generalized concentration range, varies from about 1.0 to 35.0 weight percent of the total photoresist solids. The range is generalized because the exact concentration is dependent upon the specific composition of the photoresist, especially the solvent for the photoresist and the polymer binder.

The photoactive compound is blended with the binder with both materials dissolved in a suitable solvent in conventional manner. If a dry film photoresist is desired, a liquid photoresist is formulated and then cast into a dry film in conventional manner.

During exposure of the photoresist to activating radiation, the photoactive compound that is the esterification product with the dye is both the source of photo activity and the dye that reduces reflection of light from the photoresist and substrate interface. The degree of reduction is a function of the concentration of the photoactive compound in the photoresist formulation. Since the curcim moiety may be present in the formulation in greater concentration because it is part of the photoactive compound, the increased concentration increases total absorption and reduced reflection. Moreover, since the photoactive compound contains the dye that absorbs at the exposure wavelength, better image definition is obtained.

Following preparation of the photoresist composition, the photoresist may be used in art recognized manner. For example, the photoresist may be a dry film photoresist applied to a substrate using heat and pressure. Alternatively, the photoresist may be applied to a surface in the form of a liquid coating composition. When applied as a liquid coating composition, it is coated onto the substrate in conventional manner such as by spin coating, roller coating, etc. The liquid photoresist coating is then dried and typically soft baked to yield a dry photoresist layer. Thereafter, the dry layer, whether formed from a liquid coating composition, or applied as a dry film, is exposed and developed using a developer capable of differentiating between light exposed and light unexposed areas. Typical developers comprise aqueous alkaline solutions. A typical prior art developer is disclosed in copending U.S. patent application Ser. No. 846,824 assigned to the same assignee as the subject application and incorporated herein by reference for its teachings of developer compositions and methods for use of the same.

The photoresist of the invention may be used as a stand alone photoresist layer. In such application, the resist is applied as a single resist layer. Alternatively, the photoresist may be used as one or more layers of a multilayer photoresist such as in the embodiment described in U.S. Pat. No. 4,362,809 incorporated herein by reference. In a preferred embodiment of the invention, the photoresist is used as one of several layers in a multilayer process such as that disclosed in the aforesaid U.S. Pat. No. 4,362,809.

The following examples better illustrate the invention. Example 1 constitutes the most preferred embodiment of the invention.

EXAMPLE 1

1,7-Bis-(4-hydroxy-3-methoxyphenyl)-1,6-heptadiene-3,5-dione 2-Diazo-1-oxo-5-naphthalene disulfonate [compound 9]

A stirred solution of 1,7-Bis-(4-hydroxy-3-methoxyphenyl)-1,6-heptadiene-3,5-dione [20.7 g] and 2-Diazo-1-oxonaphthalene-5-sulfonyl chloride [31.7 g] in acetone [675 ml] is treated slowly with a solution of triethylamine [12.5 g] in acetone [225 ml] over a period of two hours at room temperature. The reaction mass is allowed to stir an additional 15 minutes, and is then filtered to remove by-product triethylamine hydrochloride. The filtrate is then poured into methanol [675 ml] containing 10% sulfuric acid [56.25 ml]. After stirring the mixture for one hour, deionized water [1,680 ml] is added over a 45 minute period with continued stirring, resulting in the formation of a flocculent precipitate. The product was isolated by vacuum filtration and washed with deionized water [1000 ml]. The moist filter cake was slurried in deionized water [900 ml] and stirred overnight. It was then filtered, washed with deionized water, and dried at 40° C. overnight. A 95% product yield was obtained.

EXAMPLE 2

1,7-Bis-(4-hydroxy-3-methoxyphenyl)-1,6-heptadiene-3,5-dione 2-Diazo-1-oxo-5-naphthalene sulfonate [compound 10]

This compound was prepared by combining 1,7-Bis-(4-hydroxy-3-methoxy-phenyl)-1,6-heptadiene-3,5-dione [29.9 g] and 2-Diazo-1-oxonapthhalene-5-sulfonyl chloride [21.8 g] in acetone [675 ml] and treated slowly with a solution of triethylamine [9.0 g] in acetone [225 ml] over a period of two hours at room temperature. The reaction mass is allowed to stir an additional 15 minutes, and is then filtered to remove by-product triethylamine hydrochloride. The filtrate is poured into methanol [485 ml] containing 10% sulfuric acid [40.6 ml]. After stirring the mixture for one hour, deionized water 2,200 ml] is added over a period of one hour with continued stirring, resulting in the formation of a flocculent precipitate. The product was isolated by vacuum filtration and washed with deionized water [1000 ml]. The moist filter cake was slurried in deionized water [300 ml] and stirred overnight. It was then filtered, washed with deionized water, and dried at 40° C. overnight. A 78% product yield, corresponding to the above formula, was obtained.

EXAMPLE 3

1,7-Bis-(4-hydroxy-3-methoxyphenyl)-1,6-heptadiene-3,5-dione 2-Diazo-1-oxo-4-naphthalene disulfonate [compound 7]

This compound was prepared as in Example 1, substituting 2-Diazo-1-oxonaphthalene-4-sulfonyl chloride for 2-Diazo-1-oxonaphthalene-5-sulfonyl chloride. This procedure gave a 69% product yield.

EXAMPLE 4

1,7-Bis-(4-hydroxy-3-methoxyphenyl)-1,6-heptadiene-3,5-dione 2-Diazo-1-oxo-4-naphthalene sulfonate [compound 8]

This compound was prepared following the procedure in Example 2, substituting 2-Diazo-1-oxonaphthalene-4-sulfonyl chloride for 2-Diazo-1-oxonaphthalene-5-sulfonyl chloride. This procedure gave a 73% product yield.

EXAMPLE 5

A positive-working photoresist formulation was prepared by first dissolving a blend of novolak resins in ethylene glycol dimethyl ether, this solution containing 20% to 30% by weight of resin. To this solution, the compound disclosed in Example 1 was added in sufficient quantity so as to provide adequate inhibition and acceleration of resin dissolution in unexposed and exposed areas, respectively, when subjected to an imaging process. The above composition is filtered through a 0.2 micrometer pore size filter, then spin coated onto silicon wafers using SVG 80 equipment [Silicon Valley Group, Inc.] at a spin speed of 5000 rpm. The coated wafers are baked in a forced air convection oven at 90° C. for 30 minutes. Once cooled, the thickness of the coating was found to be approximately 2 micrometers. The wafers were then exposed to broadband UV radiation through a mask of opaque lines and clear spaces as small as 1.0 micrometer. After development in MICROPOSIT® MF-312 CD-27 alkali developer [manufactured by Shipley Company, Inc.], the mask image was found to be reproduced in the photoresist and had excellent adhesion.

The claims which follow use the expression "effective amount" in reference to the concentration of the esterification product of the photoactive compound and the curcumin dye used in the photoresist composition.

We claim:

1. A photoresist composition responsive to activating radiation at a wavelength within the range of from 200 to 460 nm comprising an admixture of a polymer binder and a photoactive compound, said photoactive compound having a concentration varying from between 1.0 and 35.0 weight percent of the total solids of the photoresist composition and containing at least ten percent of an esterification product of a diazooxide and curcumin dye having two pendant hydroxyl groups.

2. The photoresist of claim 1 wherein the diazooxide corresponds to the following general formula:

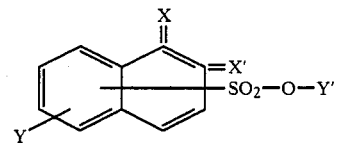

where X and X' are $N_2$ or O and are different from each other, Y is hydrogen or halogen and Y' is halogen.

3. The photoresist of claim 2 wherein the photoactive compound corresponds to the following general formula:

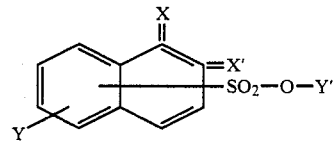

wherein X and X' are $N_2$ or O and are different from each other, Y is hydrogen or halogen and Y' is 1,7-bis-(4-hydroxy-3-methoxyphenyl)-1,6-heptadiene-3,5-dione.

4. The photoresist of claim 2 wherein the binder is a member selected from the group of novolak resins; polyglutarimides; polyvinyl alcohol; a terpolymer that is the reaction product os an alkyl acrylate, a styrene and an acid; and the polyamic condensation products of an aromatic dianhydride and an aromatic di-primary amine.

5. The photoresist of claim 1 wherein the photoactive compound is a mixture of a diazo oxide photoactive compound free of curcim in its structure and the esterification product of a diazo oxide and curcumin dye.

6. The photoresist of claim 1 wherein the photoactive compound is the esterification product of a diazo oxide and curcumin dye.

7. The photoresist of claim 4 wherein the binder is a novolak resin.

8. The photoresist of claim 7 in the form of a dry film.

9. The photoresist of claim 7 where the photoresist is a liquid coating composition.

10. The photoresist of claim 4 wherein the binder is a polyglutarimide.

11. The photoresist of claim 10 in the form of a dry film.

12. The photoresist of claim 11 where the dry film is one of several layers of photoresist.

13. The photoresist of claim 11 where the dry film is a planarizing layer in a multilayer film combination.

14. The photoresist of claim 4 where the binder is a polyvinyl phenol.

15. The photoresist of claim 14 in the form of a dry film.

16. The photoresist of claim 14 where the photoresist is a liquid coating composition.

17. A photoactive compound that is the esterification product of curcumin dye having two pendant hydroxyl groups and a diazooxide where the diazooxide corresponds to the following general formula:

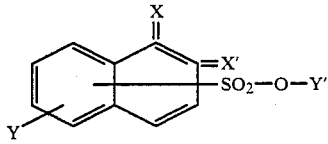

where X and X' are $N_2$ or O and are different from each other, Y is hydrogen or halogen and Y' is halogen.

18. The photoactive compound of claim 17 where the esterification product is a member selected from the group of monoesters, diesters and mixtures of monoesters and diesters.

19. The photoactive compound of claim 18 where the esterification product is a mixture of a monoester and a diester.

* * * * *